(12) United States Patent
Olbrich et al.

(10) Patent No.: US 7,915,551 B2
(45) Date of Patent: Mar. 29, 2011

(54) SWITCHING DEVICE HAVING A COUPLING ELEMENT

(75) Inventors: Werner Olbrich, Mühlheim (DE); Karl Eckstein, Feucht (DE)

(73) Assignee: Siemens Aktiengesellschaft, Munich (DE)

( * ) Notice: Subject to any disclaimer, the term of this patent is extended or adjusted under 35 U.S.C. 154(b) by 372 days.

(21) Appl. No.: 12/071,549

(22) Filed: Feb. 22, 2008

(65) Prior Publication Data

US 2008/0202904 A1    Aug. 28, 2008

(30) Foreign Application Priority Data

Feb. 28, 2007 (EP) .................................. 07004196

(51) Int. Cl.
*H01H 1/64* (2006.01)
(52) U.S. Cl. ....................................................... 200/293
(58) Field of Classification Search .................. 200/293, 200/556, 61.23; 340/443; 338/128
See application file for complete search history.

(56) References Cited

U.S. PATENT DOCUMENTS

| | | | | |
|---|---|---|---|---|
| 3,331,972 A | * | 7/1967 | Moller | 310/10 |
| 3,984,808 A | * | 10/1976 | Laz et al. | 340/443 |
| 4,547,772 A | * | 10/1985 | Ernst | 340/686.5 |
| 4,704,524 A | | 11/1987 | Masaki | |
| 4,733,214 A | * | 3/1988 | Andresen | 338/128 |
| 5,219,068 A | | 6/1993 | Piotrowski | |
| 5,239,130 A | | 8/1993 | Brasse | |
| 7,544,905 B2 | * | 6/2009 | Downer | 200/6 A |

FOREIGN PATENT DOCUMENTS

| | | |
|---|---|---|
| DE | 4115253 A1 | 11/1991 |
| EP | 998042 | 5/2000 |
| EP | 0998042 A2 | 5/2000 |

OTHER PUBLICATIONS

European Search Report.

* cited by examiner

*Primary Examiner* — Edwin A. Leon
(74) *Attorney, Agent, or Firm* — Harness, Dickey & Pierce, P.L.C.

(57) ABSTRACT

A switching device is disclosed. In at least one embodiment, the switching device includes a coupling element for non-contacting communication, and a first enclosure part. According to at least one embodiment, the switching device includes an at least partially spherical holder, in which case the partially spherical holder can rotate by virtue of its shape about at least two axes with respect to the first enclosure part. Further, the partially spherical holder is provided in order to retain and to hold the coupling element.

20 Claims, 4 Drawing Sheets

SWITCHING DEVICE HAVING A COUPLING ELEMENT

PRIORITY STATEMENT

The present application hereby claims priority under 35 U.S.C. §119 on European patent application number EP07004196 filed Feb. 28, 2007, the entire contents of which is hereby incorporated herein by reference.

FIELD

Embodiments of the invention generally relate to a switching device having a coupling element for non-contacting communication, and having a first enclosure part.

BACKGROUND

A switching device such as this, for example a non-contacting position switch or circuit breaker, can be used for a wide range of applications both in the industrial field and in the private field. The switching device generally interacts with one or more signal transmitters which, possibly, may be movable or capable of being shielded. The communication between the signal transmitter and the switching device is in this case non-contacting, that is to say without the use of cables.

Typical fields of application are automation, protection and monitoring.

EP 0 998 042 A2 discloses a switching device which operates in a non-contacting manner and has a sensor head, with the sensor head being joined to a holder such that they rotate. A holding mandrel which is required for this purpose on the rotating surface of the sensor head is provided with a circumferential groove. The sensor head can be adjusted by rotating it partially about an axis. The positioning problem for the coupling element is implemented by a diagonally split enclosure in the form of a cube, in which the coupling element, which is generally in the form of a sensor coil, is located. A multiplicity of spatial directions can be implemented by complex plug rearrangement and screw reconnection.

Alternatively, it is possible to use a plurality of coupling elements, that is to say coils, although a plurality of side lobes must be accepted.

SUMMARY

In at least one embodiment, a switching device is disclosed which is able to communicate with the coupling element in a multiplicity of variable spatial directions which do not just lie on one plane. In this case, the aim is equally to ensure that the coupling element can be adjusted in a simple manner from the start.

In the case of at least one embodiment of a switching device of the present invention, the switching device includes an at least partially spherical holder, in which case the partially spherical holder can rotate by virtue of its shape about at least two axes with respect to the first enclosure part, with the partially spherical holder being provided in order to retain and to hold the coupling element.

According to at least one embodiment of the invention, the switching device has a coupling element for non-contacting communication. The position of the coupling element within the switching device governs the optimum polarization direction of the electromagnetic wave to be received. An at least partially hollow-spherical holder, in which the coupling element is accommodated, allows a rotary movement and allows the coupling element to be held in virtually all spatial directions. In this case, the partially spherical holder may have a virtually complete spherical shape, which is mounted and guided within the switching device, for example in the first enclosure part, in a hollow spherical segment, in a similar manner to that in a joint pan. Conversely, it is feasible for the holding and bearing elements of the switching device to have a partially spherical holder, that is to say a holder which has spherical elements only in segments. The spherical shape makes it possible to move the partially spherical holder to virtually any feasible spatial direction, provided that the cables which are required for connection of the coupling element to further electrical components in the switching device allow this. In this context, sliding contacts or sliding rails which supply the coupling element with the correct modulated electrical signals are also feasible.

The holder according to at least one embodiment of the invention advantageously allows the coupling element to be oriented in five spatial directions, that is to say five sensor areas are generally possible, with a small number, typically two to three, of enclosure parts being required.

In one advantageous embodiment, the partially spherical holder has a handle for rotation about at least one of the rotation axes. The expression a handle refers to an element of the holder which is fitted or integrally formed and can be operated either by the operator's hand and/or by a tool in order to change the position of the holder and thus also that of the coupling element within the switching device. Combined-operation handles are particularly advantageous which, for example, allow the holder to be rotated about one axis while at the same time allowing rotation about a further axis, with a hand or a tool in each case being used for rotation.

In one advantageous embodiment, the switching device is intended for electrical connection of the coupling element to electrical components of a communication unit of the switching device. The communication unit is in this case, for example, partially integrated within the holder or else completely integrated within the partially spherical holder. This makes it possible for the switching device to have a very small size.

The first enclosure part is advantageously intended for attachment of the switching device. For functional splitting purposes, it is then useful for at least one second enclosure part to be in the form of a cover. However, alternatively, largely surrounding sheathing of the partially spherical holder by the enclosure is possible, but not always necessary. For space-saving reasons, it is feasible for the switching device itself essentially to be in the form of a sphere which, for example, can be attached by the first enclosure part on one wall. This is worthwhile when the attachment location is not made accessible for the user and there is no intention to provide security in the sense of manipulation protection. However, if the switching device is placed in the user's working area, it is more advantageous for the partially spherical holder to be at least largely shielded all round by the enclosure parts or the enclosure.

In one advantageous embodiment, an opening is provided in at least one enclosure part, in particular the first enclosure part, for operation and/or for movement of the handle. For financial reasons, a cuboid enclosure shape is often chosen, so that it is worthwhile providing an opening such as this on at least two enclosure faces, with this opening possibly extending to other enclosure faces or enclosure parts.

This opening makes it possible to reach the handle, for example with a finger or a tool.

For manipulation protection reasons, a protective cover can advantageously be provided on the opening, and ideally represents a cover with a similar angle. In this context, 'with a similar angle' means an essentially right-angled covering part.

In one advantageous embodiment, it is possible to provide the protective cover as a cover which is guided by at least one enclosure part. Thus, the partially spherical holder is better protected not just against manipulation but also, if required, against becoming dirty.

The partially spherical holder is advantageously in the form of a sensor head that can be sealed, so that sealing is ensured between the sensor head and the holding and/or guiding parts of the first enclosure part. As a further protective measure, this likewise leads to increased protection against the electrical components of the switching device becoming dirty.

Further advantageous embodiments and preferred developments of the invention can be found in the description of the figures and/or in the dependent claims.

BRIEF DESCRIPTION OF THE DRAWINGS

The invention will be described and explained in more detail in the following text with reference to the example embodiments which are illustrated in the figures, in which.

DETAILED DESCRIPTION OF THE EXAMPLE EMBODIMENTS

Figure 1:
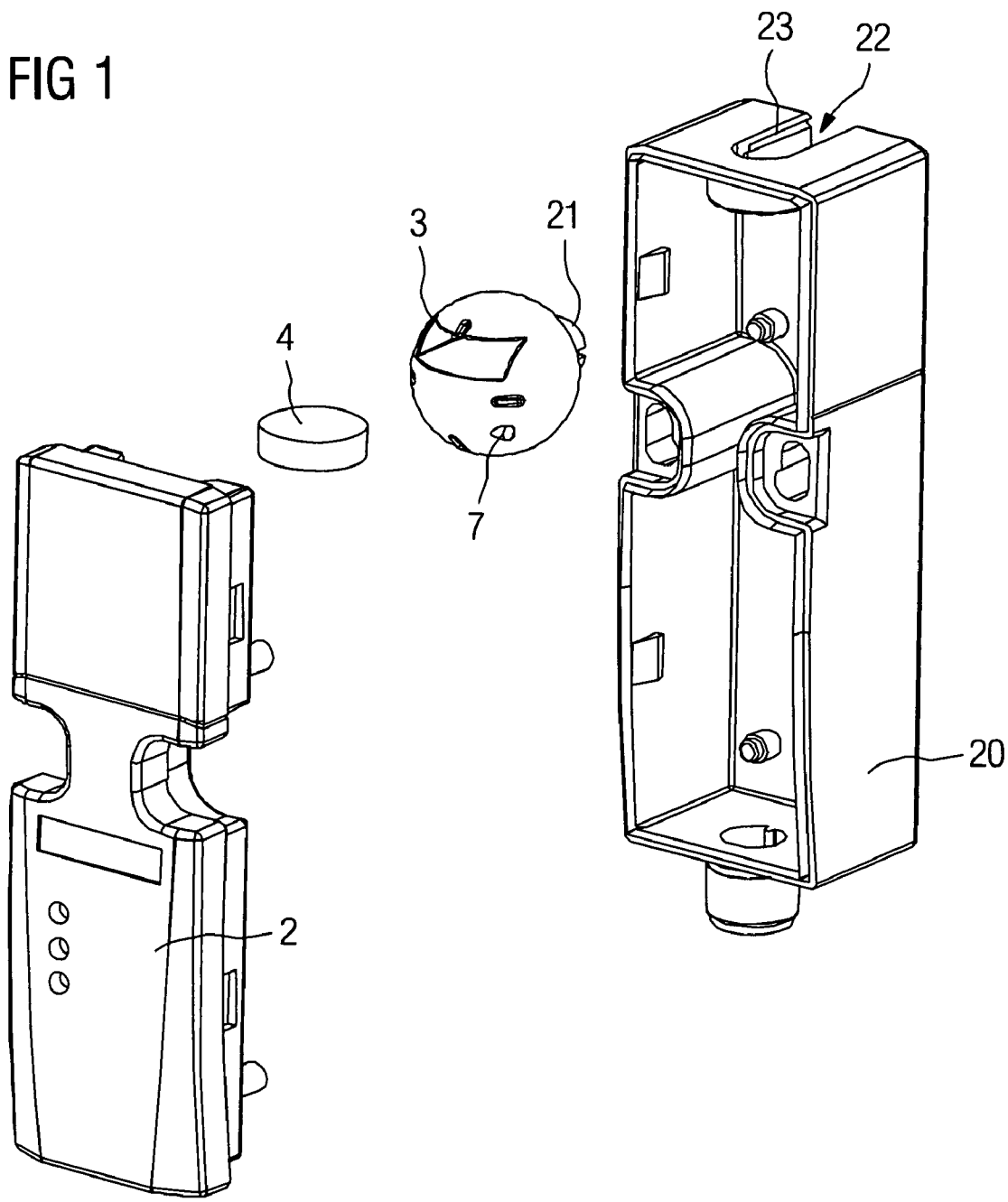
FIG. 1 shows an exploded illustration of an enclosure of a switching device with a sensor head.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

FIG. 1 shows an enclosure of a switching device 1 with a spherical holder 3, in the form of a sensor head, in the form of an exploded illustration. The coupling element 4, which, for example, is in the form of a coil, can be inserted into the holder 3 and is intended to be positioned by the holder 3. The holder 3 can be mounted such that it can be moved in the first enclosure part 20, which is also referred to as the enclosure lower part 20 in the following text. The handle 21 is in this case oriented in the direction of the opening 22 and/or projects at least partially beyond it. The enclosure lower part 20 can be closed by means of a second enclosure part 2, which is also referred to as a cover 2, via latching tabs and possibly pins.

One or more switching elements can be accommodated within the enclosure lower part 20, although these are not shown in the exploded illustration.

A hollow-spherical element is integrally formed within the walls of the enclosure lower part 20 in the vicinity of the opening 22, so that the holder 3 is mounted and guided therein like a ball joint. A stop 7 is also integrally formed on the holder 3 and can be used to limit the maximum rotation angle. This ensures that sensor lines in the form of cables cannot be twisted off or damaged by excessive loads.

Figure 2:
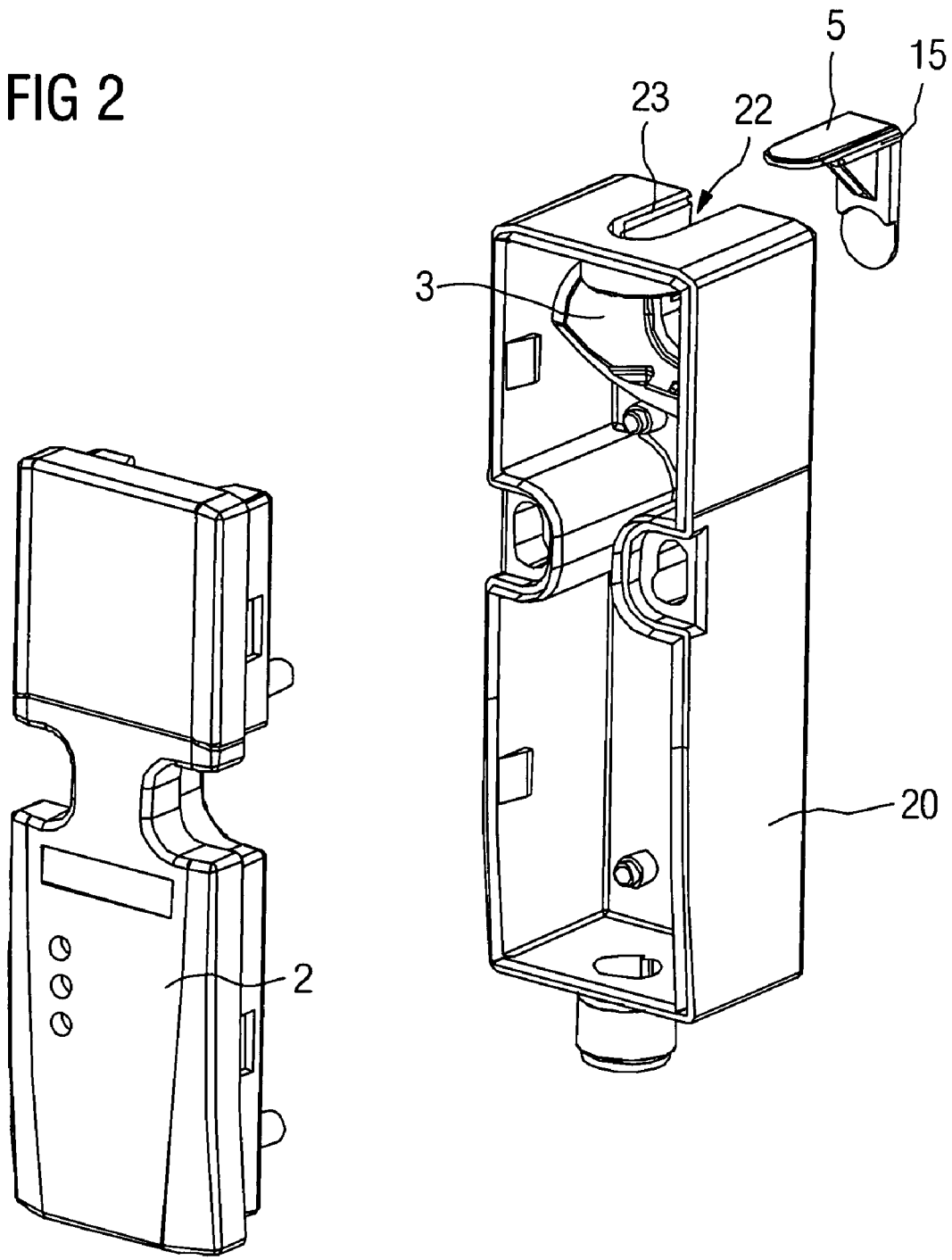
FIG. 2 shows the enclosure from FIG. 1 with a sensor head fitted.

FIG. 2 shows the enclosure from FIG. 1 with a holder 3 installed, in the form of a sensor head.

The holder 3 is adjusted by operation of the handle 21, which can be accessed through the opening 22 by means of a finger or a tool, although this cannot be seen in FIG. 2. After adjustment, the opening 22 can be closed by an essentially right-angled protective cover 5, with closure being provided by a guide groove 23 on the first enclosure part 20.

Figure 3:
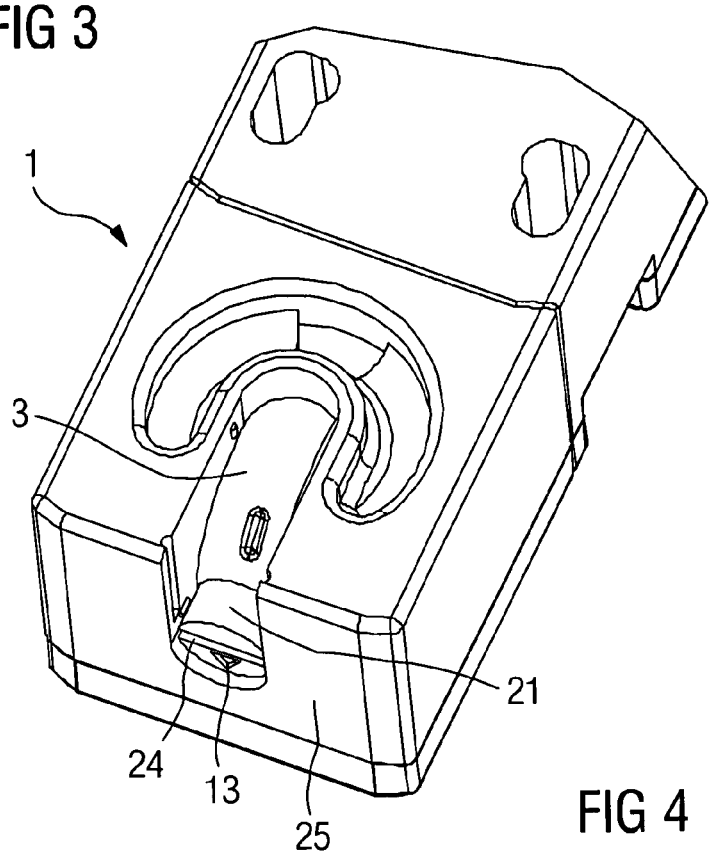
FIG. 3 shows a perspective view of a switching device.

FIG. 3 shows a perspective view of a switching device 1. The spherical holder 3 with the handle 21 is oriented such that the polarization direction of the electromagnetic waves to be received is optimally defined. In this position, the handle can be rotated by means of a screwdriver slot 24 approximately on the rotation axis, which corresponds to the longitudinal direction of the enclosure.

Figure 4:
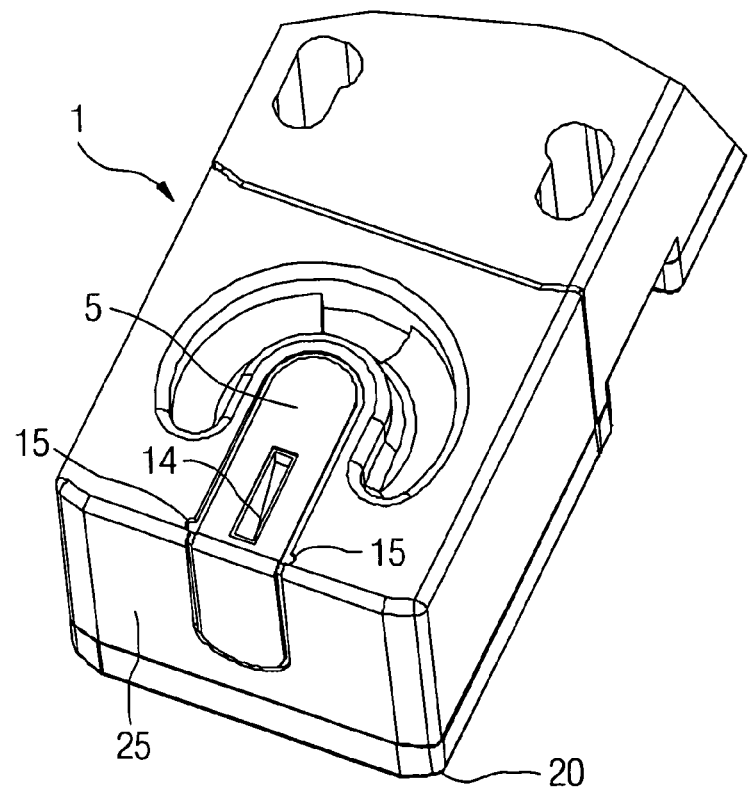
FIG. 4 shows a perspective view of the switching device from FIG. 3 with a protective cover.

FIG. 4 shows a perspective view of the switching device 1 from FIG. 3 with a protective cover 5. The guide 15 for the protective cover 5 is in this case completely recessed within the first enclosure part 20, along the guide groove 23. In consequence, the spherical holder 3 is completely shielded against mechanical influences, although this cannot be seen in FIG. 4.

For design and/or manipulation reasons, the opening, which represents an operating slot, can advantageously be closed by a protective cover 5, and the protective cover 5 cannot be removed when in the installed state. The positioning of the coupling element 4 is then preset.

The arrow 13 which is applied close to the screwdriver slot 24 indicates the direction of the sensor surface. The rib 14 fixes the holder 3 in the "front" or "up" positions. A range of protective covers 5 is feasible, which either allow a certain selection of positions of the holder 3 or in fact assist in the desired position of the holder 3.

The protective cover in this case also carries out a function relating to positioning and fixing of the holder 3.

Figure 5:
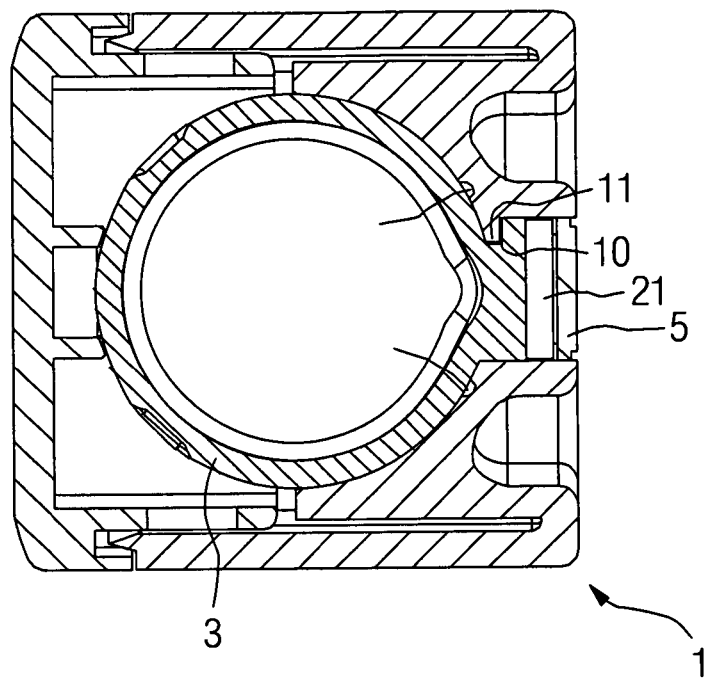
FIG. 5 shows a lateral section view of the switching device from FIG. 3 with a protective cover.

FIG. 5 shows a laterally sectioned view of the switching device 1 from FIG. 3 with the protective cover 5. However, the holder 3 is in the "front" position. This view shows the seal 16, which has an annular shape and ensures sealing with respect to the first enclosure part 20, despite the rotary movement of the holder 3. A seal with respect to the enclosure cover 2 would also be advantageous, for the same reasons.

The spherical holder 3 can be rotated through about 270° in the longitudinal direction with respect to the enclosure, and can be locked by appropriate latching grooves 8 in conjunction with the ribs 9. The stop 7 limits the rotation range to 270°, and is shown in FIGS. 1 and 2.

Furthermore, the holder 3 can be pivoted through 90° in a predetermined position, thus providing the "front" sensor range. In order to avoid adjustment errors, the holder 3 is in this position impeded via the groove 10 and the spring 11 from rotation, and in consequence is locked in this position.

Figure 6:
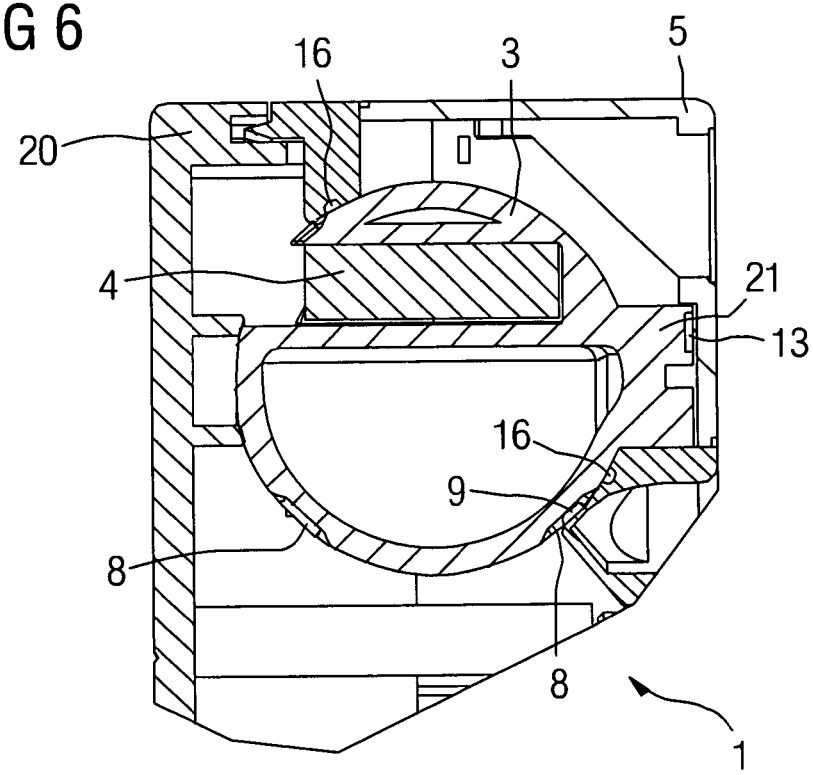
FIG. 6 shows a longitudinal section view of the switching device from FIG. 3 with a protective cover.

FIG. 6 shows a longitudinally sectioned view of the switching device 1 from FIG. 3 with a protective cover 5, showing that the spatial extent of the cover 5 provides two positions for the handle 21.

In summary, at least one embodiment of the invention relates to a switching device having a coupling element for non-contacting communication, with the switching device having an at least partially spherical holder, which can rotate about at least two axes with respect to the enclosure, by virtue of its shape. Thus, virtually any orientation of the holder, which may be in the form of a sensor head, is easily possible, with an extremely low-complexity form. Furthermore, this provides a miniaturization capability by accommodation of the communication unit of the switching device in the holder or sensor head, which is intended for retention and for holding of the coupling element.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A switching device, comprising:
   a coupling element comprising a sensor coil for non-contacting communication,
   a first enclosure part; and
   an at least partially spherical holder comprising a sensor head, rotatable about at least two axes with respect to the first enclosure part, the coupling element being retained and held within the at least partially spherical holder.

2. The switching device as claimed in claim 1, wherein the partially spherical holder includes a handle for rotation about at least one of the axes.

3. The switching device as claimed in claim 1, wherein at least one of the partially spherical holder and the switching device provides electrical connection of the coupling element to electrical components of a communication unit of the switching device.

4. The switching device as claimed in claim 3, wherein electrical components of the communication unit are arranged at least one of in the at least partially spherical holder and in an enclosure.

5. The switching device as claimed in claim 4, wherein the communication unit is contained in the at least partially spherical holder.

6. The switching device as claimed in claim 1, wherein the first enclosure part houses the switching device.

7. The switching device as claimed in claim 2, wherein an opening is provided in the first enclosure part for at least one of operation and movement of the handle.

8. The switching device as claimed in claim 7, further including a protective cover fittable into the opening.

9. The switching device as claimed in claim 8, wherein the protective cover has a first arm and a second arm at right angles to one another, the cover being guidable by adjoining surfaces of the first enclosure part formed to receive the protective cover.

10. The switching device as claimed in claim 2, wherein at least one of the at least partially spherical holder and the switching device provides electrical connection of the coupling element to electrical components of a communication unit of the switching device.

11. The switching device as claimed in claim 10, wherein electrical components of the communication unit are arranged at least one of in the at least partially spherical holder and in an enclosure.

12. The switching device as claimed in claim 11, wherein the communication unit is contained in the at least partially spherical holder.

13. The switching device as claimed in claim 2, wherein the first enclosure part houses the switching device.

14. The switching device as claimed in claim 7, wherein the opening is provided in the first enclosure part for at least one of operation and movement of the handle.

15. The switching device as claimed in claim 14, wherein the opening is closable by a protective cover.

16. The switching device as claimed in claim 15, wherein the protective cover has a first arm and a second arm at right angles to one another, the cover being guidable by adjoining surfaces of the first enclosure part formed to receive the protective cover.

17. The switching device as claimed in claim 1, further including a second enclosure part that covers an opening in the first enclosure part and the at least partially spherical holder.

18. The switching device as claimed in claim 1, wherein the at least partially spherical holder includes a stop on a surface thereof that limits rotation of the holder to 270°.

19. The switching device as claimed in claim 3, wherein the handle is enclosed within the first enclosure part.

20. The switching device as claimed in claim 1, wherein the sensor coil is a disk and the disk is held within a slot in the spherical holder.

* * * * *